United States Patent
Shin et al.

(10) Patent No.: US 6,623,798 B2
(45) Date of Patent: Sep. 23, 2003

(54) CHEMICAL VAPOR DEPOSITION METHOD FOR DEPOSITING SILICIDE AND APPARATUS FOR PERFORMING THE SAME

(75) Inventors: Ju-Cheol Shin, Seoul (KR); In-Sun Park, Gyeonggi-do (KR); Young-Cheon Kim, Gyeonggi-do (KR); Chul Whang-Bo, Gyeonggi-do (KR); Hyeon-Deok Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 197 days.

(21) Appl. No.: 09/884,993

(22) Filed: Jun. 21, 2001

(65) Prior Publication Data

US 2002/0014205 A1 Feb. 7, 2002

(30) Foreign Application Priority Data

Jun. 22, 2000 (KR) .......................................... 2000-34485

(51) Int. Cl.⁷ .............................................. C23C 16/42
(52) U.S. Cl. .............................. 427/248.1; 427/255.18; 427/255.392; 427/255.393; 438/680; 438/682; 438/683
(58) Field of Search .......................... 427/248.1, 255.18, 427/255.392, 255.393; 438/680, 682, 683

(56) References Cited

U.S. PATENT DOCUMENTS

| 5,780,360 A | * | 7/1998 | Tseng et al. ................. 438/680 |
| 5,923,988 A | * | 7/1999 | Cheng et al. ................ 438/305 |
| 6,221,771 B1 | * | 4/2001 | Ban et al. .................... 438/683 |

FOREIGN PATENT DOCUMENTS

| JP | 60237265 A | * | 11/1985 | .............. F16J/3/06 |
| JP | 7086253 | | 3/1996 | |

* cited by examiner

*Primary Examiner*—Timothy Meeks
(74) *Attorney, Agent, or Firm*—Volentine Francos, PLLC

(57) ABSTRACT

A chemical vapor deposition (CVD) method for depositing a suicide and a CVD system for performing the same are disclosed. A silicide is deposited on a substrate. Residual gases remaining from the depositing step are purged out by flowing air including $H_2O$ (g), to substantially remove fumes caused by the residual gases. In the purge step, the cycle purge is carried out at the conditions similar to the flow of atmosphere, to substantially remove the fumes.

14 Claims, 3 Drawing Sheets

CHEMICAL VAPOR DEPOSITION METHOD FOR DEPOSITING SILICIDE AND APPARATUS FOR PERFORMING THE SAME

BACKGROUND OF THE INVENTION

1. Field of the Invention

The present invention relates generally to an improved chemical vapor deposition process, and particularly to a process for the deposition of tungsten silicide from dichlorosilane (DCS), and an apparatus for performing the same.

2. Description of the Related Art

As the packing density of semiconductor devices in integrated circuits (IC) increases, feature sizes of patterns formed on the IC and the space between the patterns are becoming smaller and smaller. Conventionally, polysilicon has been used for making electrical connections, such as between a gate electrode and a bitline. However, as the pattern size and spacing becomes smaller, the RC time delay and the IR voltage drop continue to increase because of the relatively high resistivity of polysilicon. Accordingly, a polycide having similar characteristics to those of polysilicon and a resistivity less than that of polysilicon, has been used as a lower resistance alternative to polysilicon. Often, polycide is a multi-layer structure including a refractory metal silicide (silicide) over a layer of doped silicon.

Refractory metal silicides may be made from tungsten, molybdenum, titanium or tantalum, all of which have a relatively high melting point and are useful in the manufacture of VLSI circuits. A silicide may be combined with a highly doped polysilicon to form a polycide gate electrode. A known method for depositing the refractory metal silicide is by low-pressure chemical vapor deposition (LPCVD). Particularly, in case of using a tungsten suicide combined with a polysilicon, it is known that characteristics such as self-passivation, stability to wet chemicals, surface roughness, adhesion, oxidation and reproducibility are excellent.

Tungsten silicide ($WSi_x$) thin films have been deposited by a low-pressure chemical vapor deposition (LPCVD) method onto semiconductor substrates using silane ($SiH_4$) and tungsten hexafluoride ($WF_6$) as precursor gases. One problem with this process is that the deposited film does not have a conformal shape over stepped topographies as desired. Another problem with this process is that films thus deposited may have a high residual fluorine content that can adversely affect device performance. For example, when the semiconductor wafer is exposed to an elevated temperature (e.g., about 800° C. or higher), as during annealing, the excess fluorine ions can migrate through the underlying polysilicon layer into an underlying silicon oxide layer (the gate oxide). This fluorine migration can adversely impact the electrical properties of the silicon oxide, which in turn can lead to an adverse change in electrical properties of semiconductor devices including such layers.

When using a multi-chamber vacuum processing system according to a known method, a substrate to be coated with tungsten silicide first is cleaned using a fluorine plasma scrub to remove native oxide from the polysilicon layer. The cleaned substrate is then transferred into a substrate transfer chamber. This transfer chamber has a nitrogen or argon atmosphere to assist in preventing re-oxidation of the substrate, and contains a robot to transfer the substrate into a processing chamber (e.g., a tungsten deposition chamber) through a slit valve having an O-ring seal. This CVD process has become widely used for deposition of tungsten suicide from $SiH_4$ and $WF_6$. However, as substrates become larger and feature sizes for devices become smaller, the above problems of the step coverage and the residual fluorine content may be more pronounced.

An improved process for depositing $WSi_x$ films using dichlorosilane (DCS) instead of $SiH_4$ has been proposed. The resultant $WSi_x$ films have a reduced fluorine content and are more conformal than $WSi_x$ films deposited using $SiH_4$ as the precursor gas, thereby providing a solution to the $SiH_4$-based deposition process limitations.

FIG. 1 is a schematic view of a conventional deposition apparatus for depositing a tungsten silicide from dichlorosilane (DCS). A substrate such as a silicon wafer is introduced into the load-lock chamber-A 50 or load-lock chamber-B 52 of a chemical vapor deposition (CVD) apparatus. For example, after loading the wafer into the load-lock chamber-A 50, the pressure of load-lock chamber-A 50 is reduced to about 200 mTorr. Thus, the load-lock chamber-A 50 is maintained substantially at vacuum. Then, a slit valve (not shown) between a transfer module 54 and the load-lock chamber-A 50 is opened and the wafer in the load-lock chamber-A 50 is transferred into a processing chamber-C 56 or a processing chamber-D 58 by the robot arm of the transfer module 54.

When transferring the wafer into the processing chamber-D 58, the DCS deposition process progresses while introducing reaction gases into the processing chamber-D 58. After the DCS deposition is completed, the processing chamber-D 58 is pumped down to a pressure of about 20 mTorr. After completing this pumping step, a slit valve (not shown) between the transfer module 54 and the processing chamber-D 58 is opened and the wafer is transferred into a cooling stage 60 by the robot arm of the transfer module 54. After cooling the wafer in the cooling stage 60, the slit valve between the transfer module 54 and the load-lock chamber-B 52 is opened and the wafer is transferred into the load-lock chamber-B 52.

After all wafers are transferred into a cassette in the load-lock chamber-B 52 via the above-described steps, a vent gas such as nitrogen (N2) or argon (Ar) is supplied through a vent line connected with the load-lock chamber 52 until the pressure of the load-lock chamber-B 52 reaches a pressure of about 760 Torr. As a result, the load-lock chamber-B 52 is vented and the wafers are removed from the CVD system.

The reaction gases introduced into the processing chamber during the above described DCS deposition process are $WF_6$ and $SiH_2Cl_2$ gases. The reaction used to produce $WSi_x$ is:

$$WF_6 + SiH_2Cl_2 + P \rightarrow WSi_x + \text{by-product gases}$$

where, phosphorous (P) is contained in the silicon wafer (e.g., the polysilicon layer under the tungsten suicide film).

When unloading the wafer from the load-lock chamber after completion of the DCS deposition process, fumes are generated. When the temperature of the DCS deposition process is 600° C. or more, a substantial amount of fumes are generated. Further, as the concentration of P in the underlying polysilicon layer increases, these fumes are generated even more. That is, the generation of such fumes is more severe when the DCS deposition process is carried out on the bitline polysilicon layer of which the doping concentration is higher than that of the gate polysilicon layer.

As shown in the above reaction, such fumes are generated due to the by-product gases absorbed on a surface of the wafer after completion of the DCS deposition process. The components of such fumes may be phosphorus-based and/or chlorine-based gases. As a result of analyzing the components of the fumes, the phosphorous-based gas of about 56 parts-per-billion was detected by the phosphine ($PH_3$) measuring system, and thus, the by-product gases generating the fumes proved to be the P-based gases. Since the P-based and/or Cl-based fumes are noxious to the human body, the semiconductor process may not be further proceeded without removing such fumes in consideration of the safety. Accordingly, it is necessary to remove the residual gases absorbed on the wafer surface after the DCS deposition process is completed.

What is needed, therefore is a CVD method and apparatus which substantially eliminate noxious gases which plague conventional methods

SUMMARY OF THE INVENTION

In accordance with an illustrative embodiment of the present invention, there is provided a chemical vapor deposition method that includes depositing a silicide on a substrate and purging residual gases remaining from the depositing step by flowing air including gaseous $H_2O$ ($H_2O(g)$).

According to another illustrative embodiment of the present invention a substrate is loaded in a load-lock chamber of a chemical vapor deposition apparatus. The substrate is transferred into a processing chamber. A silicide is deposited on the substrate in the processing chamber. The substrate is transferred into the load-lock chamber. Residual gases remaining from the deposition step is purged out by flowing air including gaseous $H_2O$ ($H_2O(g)$) into the load-lock chamber.

In accordance with another illustrative embodiment of the present invention, there is provided a chemical vapor deposition apparatus including a load-lock chamber, a processing chamber mounted on the load-lock chamber, a vent line connected with the load-lock chamber, and an air purge line of flowing air including $H_2O$ (g) into the load-lock chamber to purge residual gases in the load-lock chamber.

Advantageously, according to exemplary embodiments of the present invention, air including $H_2O$ (g) is supplied to purge the residual gases remaining after deposition of the silicide film, thereby substantially removing the fumes generated due to the residual gases.

BRIEF DESCRIPTION OF THE DRAWINGS

The invention is best understood from the following detailed description when read with the accompanying drawing figures. It is emphasized that the various features are not necessarily drawn to scale. In fact, the dimensions may be arbitrarily increased or decreased for clarity of discussion.

DETAILED DESCRIPTION

Figure 1:
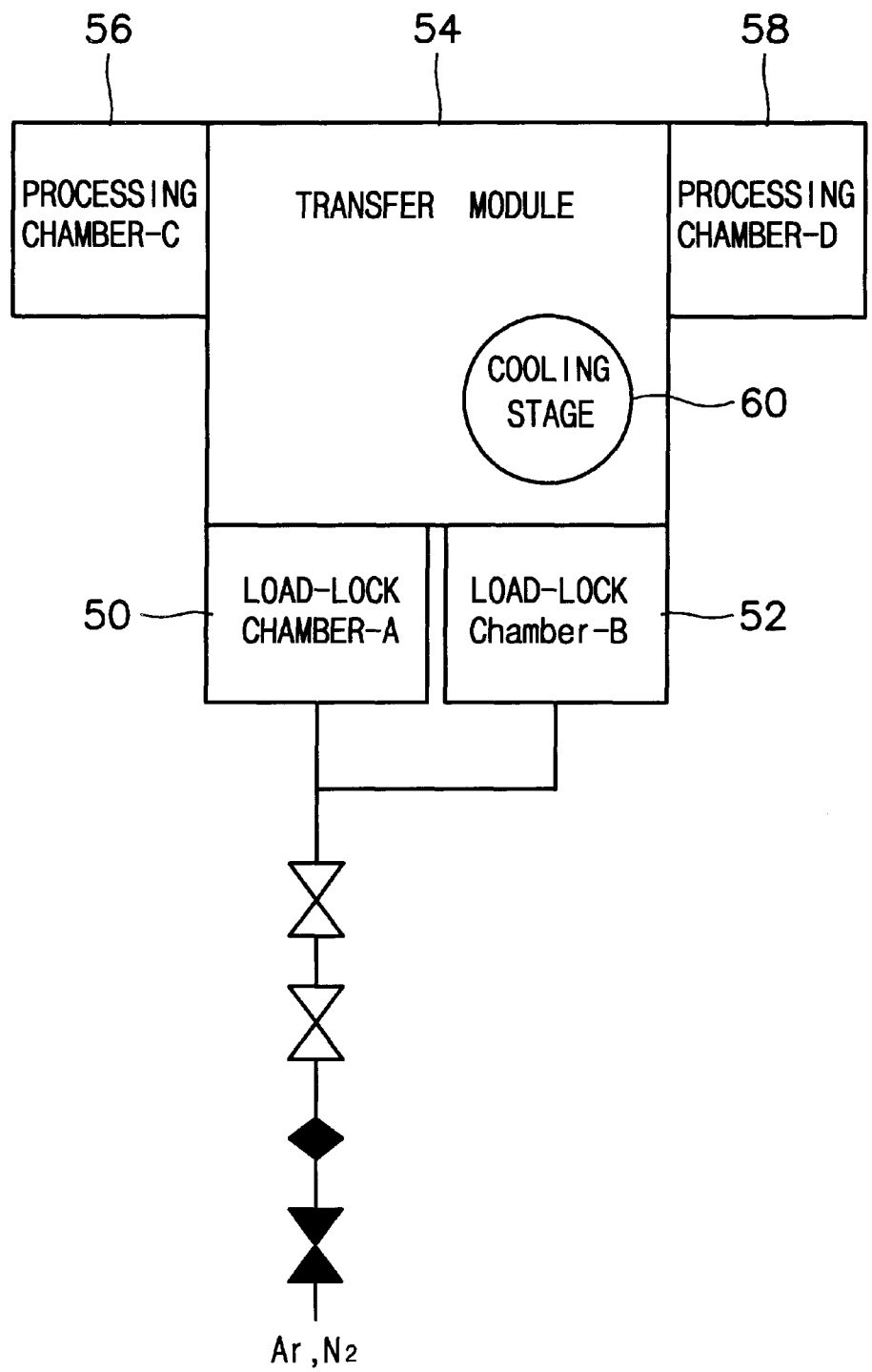
FIG. 1 is a schematic view of a conventional deposition apparatus for depositing a tungsten suicide from dichlorosilane (DCS).

In the following detailed description, for purposes of explanation and not limitation, exemplary embodiments disclosing specific details are set forth in order to provide a thorough understanding of the present invention. However, it will be apparent to one having ordinary skill in the art having had the benefit of the present disclosure, that the present invention may be practiced in other embodiments that depart from the specific details disclosed herein. Moreover, descriptions of well-known devices, methods and materials may be omitted so as to not obscure the description of the present invention.

Briefly, the present invention relates to a silicide depositing method that illustratively includes depositing a silicide on a substrate and purging residual gases remaining from the depositing step by flowing air including $H_2O$ (g), to thereby remove fumes caused by the residual gases.

In the depositing step, a tungsten silicide ($WSi_x$) is deposited via a low-pressure chemical vapor deposition (LPCVD) method at a temperature illustratively in the range of approximately 500° C. to approximately 800° C. and a pressure illustratively in the range of approximately 0.1 Torr to approximately 760 Torr, using tungsten hexafluoride ($WF_6$) and dichlorosilane (DCS) as reaction gases.

In the purging step, air including $H_2O$ (g) may be used solely or be mixed with oxygen ($O_2$) and at least one inert gas. The inert gas plays a role of preventing the silicide film coated on the substrate from reacting to $H_2O$ (g) or $O_2$ (g). The inert gases are illustratively, argon (Ar), nitrogen ($N_2$) or helium (He). It is preferred that each partial pressure of $O_2$ and $H_2O$ (g) is illustratively approximately 10% or more in the gas mixture comprising air including $H_2O$ (g), $O_2$ and inert gas. Further, when performing the purging step for removing fumes, air including $H_2O$ (g), $O_2$ gas and inert gas may be successively supplied to suppress the generation of particles.

In general, P-based and/or Cl-based residual gases absorbed on the surface of the wafer after depositing the DCS react with $H_2O$ (g) (and $O_2$ (g), if mixed with $H_2O$ (g)) to form a stable compound. Thereby, these residual gases are advantageously desorbed from the surface of the wafer. Accordingly, if the wafer is left as it is in the atmosphere after depositing the DCS, the residual gases generating the fumes react with $H_2O$ (g) (and $O_2$ (g), if mixed with $H_2O$ (g)) in the atmosphere, and are desorbed from the wafer surface.

As can be appreciated, since the P-based or Cl-based gases are very noxious to the human body, to leave the wafer in the atmosphere causes the safety issues. Accordingly, if air including $H_2O$ (g) (and O2 (g), if mixed with $H_2O$ (g)) is supplied into the apparatus after depositing the DCS, the P-based and/or Cl-based residual gases absorbed on the wafer surface can be removed without causing the safety issues. At this time, in order to maximize the effect of removing fumes, the removal of residual gases (cycle purging) can be carried out at a pressure illustratively in the range of approximately 500 Torr to approximately 760 Torr; more particularly in the range of approximately 600 Torr to approximately 760 Torr.

Figure 2:
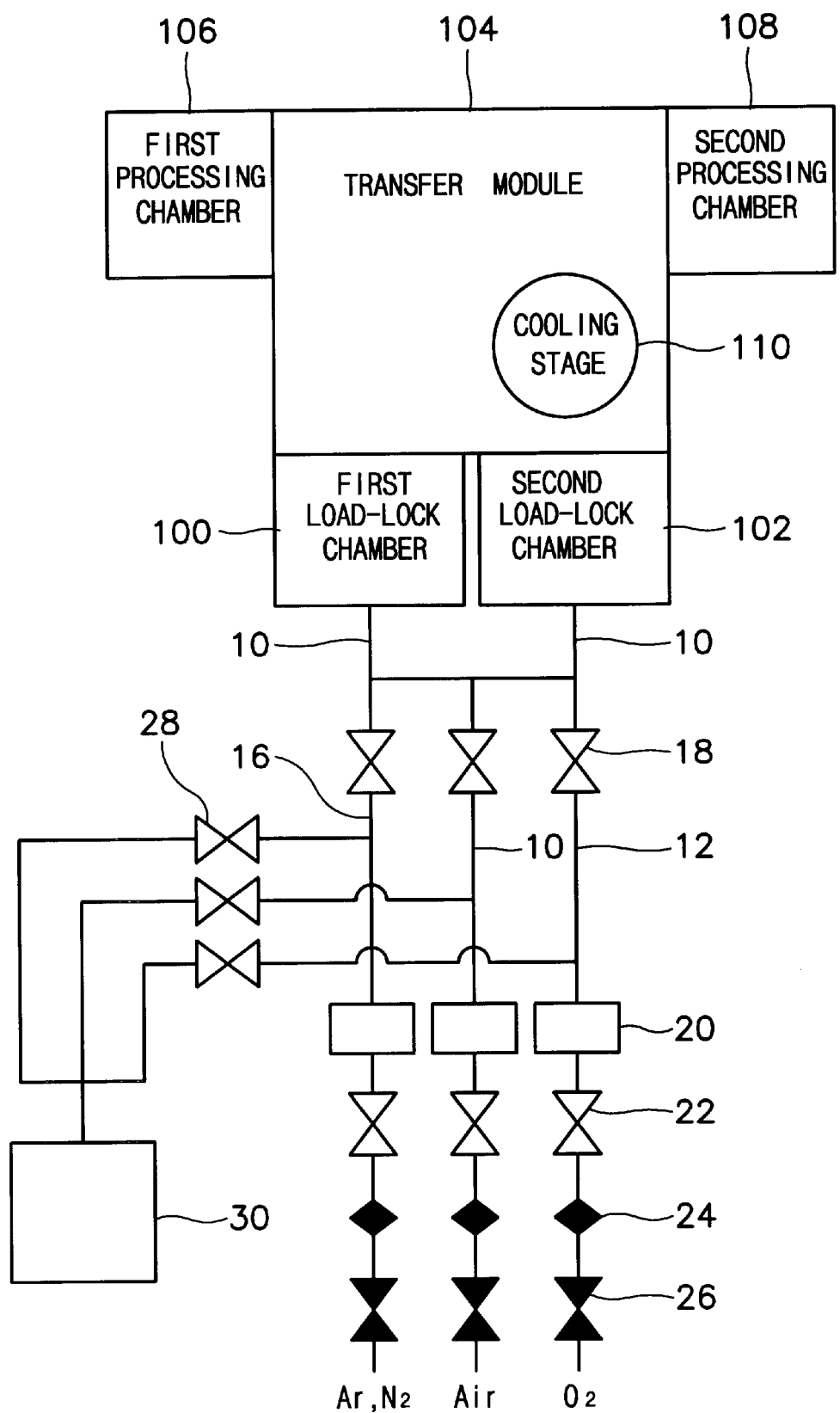
FIG. 2 is a schematic view of a chemical vapor deposition apparatus according to an exemplary embodiment of the present invention.

Referring to FIG. 2, a CVD system according to an illustrative embodiment of the present invention comprises first and second load-lock chambers 100 and 102, respectively; first and second processing chambers 106 and 108, respectively, mounted on the first and second load-lock chambers 100 and 102; source lines (not shown), which are connected to the first and second processing chambers 106 and 108 and supply reaction gases into the first and second processing chambers 106 and 108; vent line 16, which is connected with the first and second load-lock chambers 100 and 102 and supplies an inert gas such as nitrogen or argon into the first and second load-lock chambers 100 and 102; and air purge lines 10 which are connected to the first and second load-lock chambers 100 and 102, and which supply air including $H_2O$ (g) into the first and second load-lock chambers 100 and 102 to purge residual gases in the first and second load-lock chambers 100 and 102.

According to the illustrative embodiment of the present invention, an $O_2$ gas line 12 is connected to air purge line 10. The air purge line 10, the $O_2$ gas line 12 and the vent line 16 are connected to one another. Therefore, the gas mixture comprising the inert gas supplied through the vent line 16, the air including $H_2O$ (g) and $O_2$ gas can be used as the purge gas.

Alternatively, the air including $H_2O$ (g) may be used solely. Alternatively, the purge step may be carried out by successively supplying the air including $H_2O$ (g), an $O_2$ gas, and an inert gas.

First, second and third valves 18, 22 and 26 and mass flow controllers (MFC) 20, which are operated by controllers (not shown) and regulate the flow and amount of gases, may be connected to the air purge line 10, the $O_2$ gas line 12 and the vent line 16, respectively. Further, filters 24 for removing particles by filtering air and gases supplied via these lines may be connected to these lines, respectively.

According to the illustrative embodiment of the present invention, when residual gases in the first and second load-lock chambers 100 and 102 are purged out by supplying air into the first and second load-lock chambers 100 and 102 via the air purge lines 10, the purged residual gases are exhausted to a vacuum pump 30 connected with vent lines 16. Further, in order to more quickly exhaust the purged residual gases, the air purge line 10 and the $O_2$ gas line 12 may be connected with the vacuum pump 30, respectively.

In general, since air including $H_2O$ (g) or $O_2$ (g) should not be supplied into the first and second processing chambers 106 and 108 when the first and second processing chambers 106 and 108 maintain a vacuum state, it is useful to perform the purge step by connecting the air purge line 10 and the $O_2$ gas line 12 to the first and second load-lock chambers 100 and 102. Accordingly, the source line connected with the first and second processing chambers 106 and 108 and the air purge line 10 are illustratively separated from each other.

Figure 3:
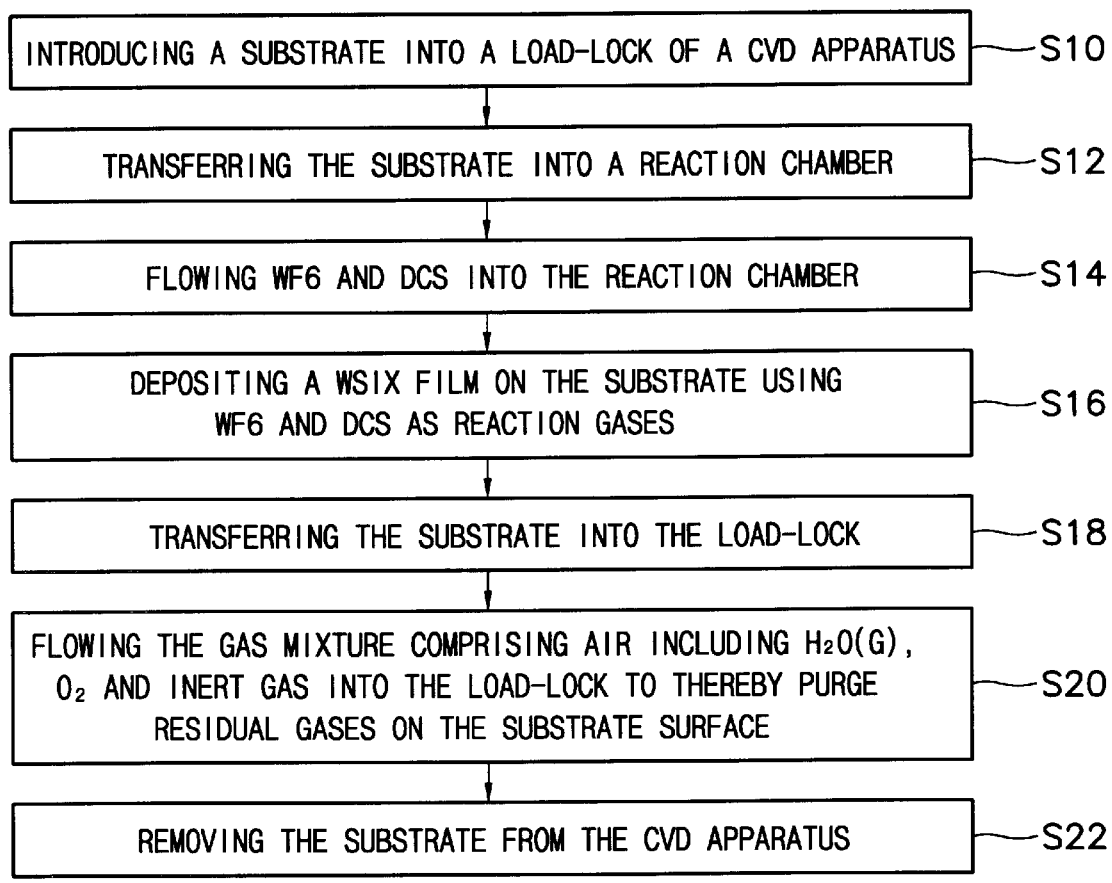
FIG. 3 is a flowchart illustrating a purge method for depositing a silicide according to an exemplary embodiment of the present invention.

FIG. 3 is a flowchart of a purge method for depositing a suicide according to an illustrative embodiment of the present invention.

Referring to FIG. 3, a substrate such as a silicon wafer is first loaded in a load-lock chamber of a CVD system (S10). The substrate is transferred into a processing chamber (i.e., a reaction chamber) of the CVD system (S12), and then, $WF_6$ and DCS are introduced into the reaction chamber (S14). Using $WF_6$ and DCS as reaction gases, a tungsten silicide ($WSi_x$) is deposited on the substrate (S16). After transferring the substrate into the load-lock chamber (S18), the gas mixture comprising air including $H_2O$ (g), $O_2$ (g) and an inert gas is introduced into the load-lock chamber, thereby purging residual gases absorbed on the surface of the substrate (S20). Then, the substrate is removed from the CVD system (S22).

Hereinafter, a method of depositing a suicide according to an illustrative embodiment of the present invention is described, in more detail, with reference to FIGS. 2 and 3.

Referring to FIGS. 2 and 3, a substrate such as a silicon wafer is loaded into a cassette in the first load-lock chamber 100 or the second load-lock chamber 102 of the CVD system (S10). Illustratively, after loading the wafer into the first load-lock chamber 100, the first load-lock chamber 100 is pumped down to the pressure of approximately 200 mTorr. The first load-lock chamber 100 substantially maintains a vacuum state.

Next, a slit valve (not shown) between the transfer module 104 and the first load-lock chamber 100 is opened and the wafer in the first load-lock chamber 100 is transferred into the first processing chamber 106 or the second processing chamber 108 by the robot arm of the transfer module 104 (S12).

If the wafer is transferred into the second processing chamber 108, reaction gases, e.g., $WF_6$ and DCS are introduced into the second processing chamber 108 (S14). By doing so, a tungsten silicide ($WSi_x$) is deposited on the wafer by the reaction of $WF_6$ and DCS (S16). Illustratively, a LPCVD process is carried out at a pressure illustratively in the range of approximately 0.1 Torr to approximately 760 Torr and a temperature illustratively in the range of approximately 500° C. to approximately 800° C.

After the deposition is completed, the second processing chamber 108 is pumped out to the pressure of approximately 200 mTorr, thereby maintaining the second processing chamber 108 at a high vacuum state. After the completion of this pumping step, a slit valve (not shown) between the transfer module 104 and the second processing chamber 108 is opened and then, the wafer is transferred into a cooling stage 110 by the robot arm of the transfer module 104. After cooling the wafer at the cooling stage 110 illustratively for approximately 60 to approximately 300 seconds, the slit valve between the transfer module 104 and the second load-lock chamber 102 is opened and then, the wafer is transferred into the load-lock chamber 102 (S18).

If all wafers are transferred into the cassette of the second load-lock chamber 102 via the above-described steps, residual gases absorbed on the surface of the wafer after the DCS deposition are substantially removed by supplying only air including $H_2O$ (g); or the gas mixture of air including $H_2O$ (g), $O_2$ (g), and inert gas, as the purge gas (S20). Then, the purged residual gases are exhausted to the vacuum pump 30 (S22). These steps are described presently.

The first, second and third valves 26, 22 and 18, which are connected respectively to the air purge line 10, the $O_2$ gas line 12 and the vent line 16, are successively opened to introduce the gas mixture of air including $H_2O$ gas, $O_2$ gas and inert gas into the second load-lock chamber 102. Then, after closing the valves of the air purge line 10 and the $O_2$ gas line 12, the valve 18 of the vent line 16 and the valve 28 of the vacuum pump 30 are opened. By doing so, the residual gases purged from the second load-lock chamber 102 are exhausted through the vent line 16 to the vacuum pump 30. At this time, if the vacuum pump 30 is also connected with the air purge line 10 and the $O_2$ gas line 12, the residual gases purged from the second load-lock chamber 102 can be more quickly exhausted.

Alternatively, in the purge step, the cycle purging may be carried out ten times or more at a pressure of illustratively in the range of approximately 500 Torr to approximately 760 Torr; more particularly in the range of approximately 600 Torr to approximately 760 Torr. Thus, the residual gases absorbed on the wafer surface can be more effectively removed.

Then, after the purge step is completed, a vent gas such as nitrogen ($N_2$) or argon (Ar) is supplied through the vent line 16 connected with the second load-lock chamber 102 until the pressure of load-lock chamber 102 is approximately 760 Torr. As a result, the second load-lock chamber 102 is vented and the wafers are removed from the CVD system.

Applicants have tested the deposition of silicide layer by changing the deposition conditions and purge conditions.

The following table 1 shows exemplary experiment results obtained from the various methods for removing the generation of fumes.

TABLE 1

| No | Deposition conditions and purge conditions | Amount of fumes |
|----|---------------------------------------------|-----------------|
| 1 | Deposition at 700° C. (wafer cooling for 60 sec) | A |
| 2 | Deposition at 650° C. or less (cooling for 60 sec) | B |
| 3 | Deposition at 700° C. cooling for 300 sec | B |
| 4 | Deposition at 700° C. cooling for 1200 sec | B |
| 5 | Deposition at 700° C. cooling for 300 sec Load-lock cycle purging 10 times using $N_2$ | B |
| 6 | Deposition at 700° C. cooling for 300 sec Load-lock cycle purging 10 times using dry air | C |
| 7 | Deposition at 700° C. cooling for 300 sec Load-lock cycle purging 10 times at a pressure of approximately 600 Torr to approximately 760 Torr, using air including $H_2O$ (g) | D |
| 8 | Deposition at 700° C. cooling for 300 sec Load-lock cycle purging 10 times at a pressure of approximately 600 Torr to approximately 760 Torr, using air including $H_2O$ (g) | X |

Here, the amount of fumes was obtained using olfactoric senses after unloading the cassette from the load-lock chamber, while approaching on the wafer at a distance of about 5 cm to 15 cm. The symbol A indicates that substantial fumes are generated. The symbol B indicates that the verification of fumes is possible. The symbol D indicates that the verification of fumes is exceedingly difficult.

As shown in the table 1, according to the method of decreasing the silicide deposition temperature (No. 1 and No. 2), the method of increasing the wafer cooling time (No. 3 and No. 4) or the method of cycle-purging the load-lock chamber by using $N_2$ gas (No. 5), fumes are not removed completely. Further, in the case of using dry air as the purge gas (No. 6), fumes are not completely removed.

In the case of using air including $H_2O$ (g) as in the present invention (No. 7 and No. 8), removing fumes is substantially more effective as compared to the other methods. However, as the pressure of cycle-purge decreases to 500 Torr or less (No.7), the removing effect is somewhat diminished.

Accordingly, in the case of performing cycle-purge at a pressure illustratively in the range of approximately 600 Torr to approximately 760 Torr similar to the flow of atmosphere by using air including $H_2O$ (g), removing the generation of fumes is most effective.

According to the present invention as described above, air including $H_2O$ (g) is supplied to purge the residual gases remaining from the deposition of the silicide film, thereby removing the fumes caused by the residual gases. The inert gas and $O_2$ gas may be mixed with air including $H_2O$ (g). In the purge step, the cycle-purge can be carried out at a pressure of illustratively in the range of approximately 600 Torr to approximately 760 Torr similar to the flow of atmosphere, thereby maximizing the removing effect of fumes.

While the present invention has been particularly shown and described with reference to illustrative embodiments thereof, it will be understood by those skilled in the art that various changes in form and details may be effected without departing from the spirit and scope of the invention as defined by the appended claims and the legal equivalents thereof.

What is claimed is:

1. A chemical vapor deposition method, comprising:

(i) depositing a silicide on a substrate; and (ii) purging residual gases remaining from said depositing step by using air including $H_2O$ gas.

2. The method as recited in claim 1, wherein in (i), said silicide is deposited using tungsten hexafluoride ($WF_6$) and dichlorosilane (DCS) as reaction gases.

3. The method as recited in claim 1, wherein in (i), said silicide is deposited at a pressure in the range of approximately 0.1 Torr to approximately 760 Torr and a temperature in the range of approximately 500° C. to approximately 800° C.

4. The method as recited in claim 1, wherein in (ii), said air including $H_2O$ gas further includes $O_2$ gas and at least one inert gas.

5. The method as recited in claim 4, wherein said at least one inert gas is selected from the group consisting of argon (Ar), nitrogen ($N_2$), and helium (He).

6. The method as recited in claim 4, wherein a partial pressure of each of said $O_2$ gas and said $H_2O$ gas is approximately 10% or more.

7. The method as recited in claim 1, wherein the method further comprises:

after (ii), purging said residual gases by successively flowing $O_2$ gas and at least one inert gas.

8. The method as recited in claim 1, wherein in (ii), said purging of said residual gases is carried out at a pressure in the range of approximately 500 Torr to approximately 760 Torr.

9. A chemical vapor deposition method, comprising:

(i) loading a substrate in a load-lock chamber of a CVD system;

(ii) transferring said substrate into a processing chamber;

(iii) depositing a silicide on said substrate in said processing chamber;

(iv) transferring said substrate into said load-lock chamber; and (v) purging residual gases remaining from said depositing step by flowing air including $H_2O$ gas into said load-lock chamber.

10. The method as recited in claim 9, wherein in (iii), $WF_6$ and DCS are introduced as reaction gases into said processing chamber.

11. The method as recited in claim 9, wherein in (v), said air including $H_2O$ gas further includes $O_2$ gas and at least one inert gas.

12. The method as recited in claim 11, wherein a partial pressure of each of said $O_2$ gas and said $H_2O$ gas is 10% or more.

13. The method as recited in claim 9, wherein in (v), said purging of said residual gases is carried out at a pressure in the range of approximately 500 Torr to approximately 760 Torr.

14. The method as recited in claim 9, the method further comprising:

after (v), purging said residual gases by successively flowing $O_2$ gas and at least one inert gas.

* * * * *